United States Patent
Lu et al.

(10) Patent No.: US 9,613,864 B2
(45) Date of Patent: Apr. 4, 2017

(54) LOW CAPACITANCE INTERCONNECT STRUCTURES AND ASSOCIATED SYSTEMS AND METHODS

(71) Applicant: Micron Technology, Inc., Boise, ID (US)

(72) Inventors: Jin Lu, Boise, ID (US); Hongqi Li, Boise, ID (US); Kevin Torek, Meridian, ID (US); Thy Tran, Boise, ID (US); Alex Schrinsky, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/514,936

(22) Filed: Oct. 15, 2014

(65) Prior Publication Data

US 2016/0111372 A1 Apr. 21, 2016

(51) Int. Cl.
*H01L 23/48* (2006.01)
*H01L 21/768* (2006.01)
(Continued)

(52) U.S. Cl.
CPC .. *H01L 21/76898* (2013.01); *H01L 21/76831* (2013.01); *H01L 23/481* (2013.01);
(Continued)

(58) Field of Classification Search
CPC ........... H01L 23/53295; H01L 21/3081; H01L 21/31116; H01L 21/3212; H01L 21/76831; H01L 21/76898; H01L 23/481
See application file for complete search history.

(56) References Cited

U.S. PATENT DOCUMENTS 8,211,756 B2 7/2012 Feng et al.
8,492,241 B2 * 7/2013 Cheng .................. H01L 21/743
257/774

(Continued)

OTHER PUBLICATIONS

Katti, G. et al., "Through-Silicon-Via Capacitance Reduction Technique to Benefit 3-D IC Performance," IEEE Electron Device Letters, vol. 31, No. 6, pp. 549-551, Jun. 2010.

(Continued)

*Primary Examiner* — Daniel Shook
(74) *Attorney, Agent, or Firm* — Perkins Coie LLP (57) ABSTRACT

Semiconductor device interconnect structures having low capacitance and associated systems and methods are disclosed herein. In one embodiment, a method of manufacturing an interconnect structure includes forming an opening in a surface of a semiconductor device and forming an interconnect structure at least within the opening. Forming the interconnect structure includes depositing a first insulator material on both the surface and a sidewall of the opening, selectively removing a first portion of the first insulator material on the surface over a second portion of the first insulator material on the sidewall, depositing a second insulator material on the second portion, and depositing a conductive material on the second insulator material. The method further includes selecting the thickness of the first and second insulators materials based on a threshold level of capacitance between the sidewall and the conductive material.

21 Claims, 9 Drawing Sheets

(51) Int. Cl.
H01L 21/308 (2006.01)
H01L 21/311 (2006.01)
H01L 21/321 (2006.01)

(52) U.S. Cl.
CPC ..... *H01L 21/3081* (2013.01); *H01L 21/31116* (2013.01); *H01L 21/3212* (2013.01); *H01L 2924/0002* (2013.01)

(56) References Cited

U.S. PATENT DOCUMENTS

| | | |
|---|---|---|
| 8,525,343 B2 | 9/2013 | Yu et al. |
| 2012/0074584 A1* | 3/2012 | Lee .................. H01L 21/76898 257/774 |
| 2012/0080802 A1 | 4/2012 | Cheng et al. |
| 2013/0037944 A1 | 2/2013 | Lee et al. |
| 2013/0161825 A1 | 6/2013 | Hsu et al. |
| 2013/0279280 A1 | 10/2013 | Franzon et al. |

OTHER PUBLICATIONS

Zhang, L. et al., "Through Silicon Via Fabrication with Low-K Dielectric Liner and Its Implications on Parasitic Capacitance and Leakage Current," Japanese Journal of Applied Physics, vol. 51, pp. 04DB03-1-04DB03-4, 2012, DOI: 10.1143/JJAP.51.04DB03.

* cited by examiner

LOW CAPACITANCE INTERCONNECT STRUCTURES AND ASSOCIATED SYSTEMS AND METHODS

TECHNICAL FIELD

The present technology relates to semiconductor device interconnect structures, including through-silicon interconnect structures, having improved electrical properties, such as reduced capacitance.

BACKGROUND

Packaged semiconductor dies, including memory chips, microprocessor chips, and imager chips, typically include one or more semiconductor dies mounted on a package substrate and encased in a plastic protective covering. Each semiconductor die includes an integrated circuit and bond pads electrically connecting the integrated circuit to a plurality of wirebonds. The wirebonds are coupled to the package substrate, and the package substrate, in turn, electrically routes signals between the die and a printed circuit board connected to off-chip electrical devices.

Some die packages have through-silicon vias (TSVs) in lieu of wirebonds. A TSV extends through the substrate of the die and electrically connects the die to the package substrate. A TSV can reduce the package footprint and improve electrical performance. However, one challenge with TSVs is that they reduce circuit density within the die because they take up space within the die substrate.

DETAILED DESCRIPTION

Specific details of several embodiments of semiconductor device interconnect structures having low capacitance and associated systems and methods are described below. The terms "semiconductor device" and "semiconductor die" generally refer to a solid-state device that includes semiconductor material, such as a logic device, memory device, or other semiconductor circuit, component, etc. Also, the terms "semiconductor device" and "semiconductor die" can refer to a finished device or to an assembly or other structure at various stages of processing before becoming a finished device. Depending upon the context in which it is used, the term "substrate" can refer to a wafer-level substrate or to a singulated, die-level substrate. A person skilled in the relevant art will recognize that suitable steps of the methods described herein can be performed at the wafer level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1A-5.

As used herein, the terms "vertical," "lateral," "upper" and "lower" can refer to relative directions or positions of features in the semiconductor die assemblies in view of the orientation shown in the Figures. For example, "upper" or "uppermost" can refer to a feature positioned closer the top of a page than another feature. These terms, however, should be construed broadly to include semiconductor devices having other orientations, such as inverted or inclined orientations where top/bottom, over/under, above/below, up/down and left/right can be interchanged depending on the orientation.

Figure 1A:
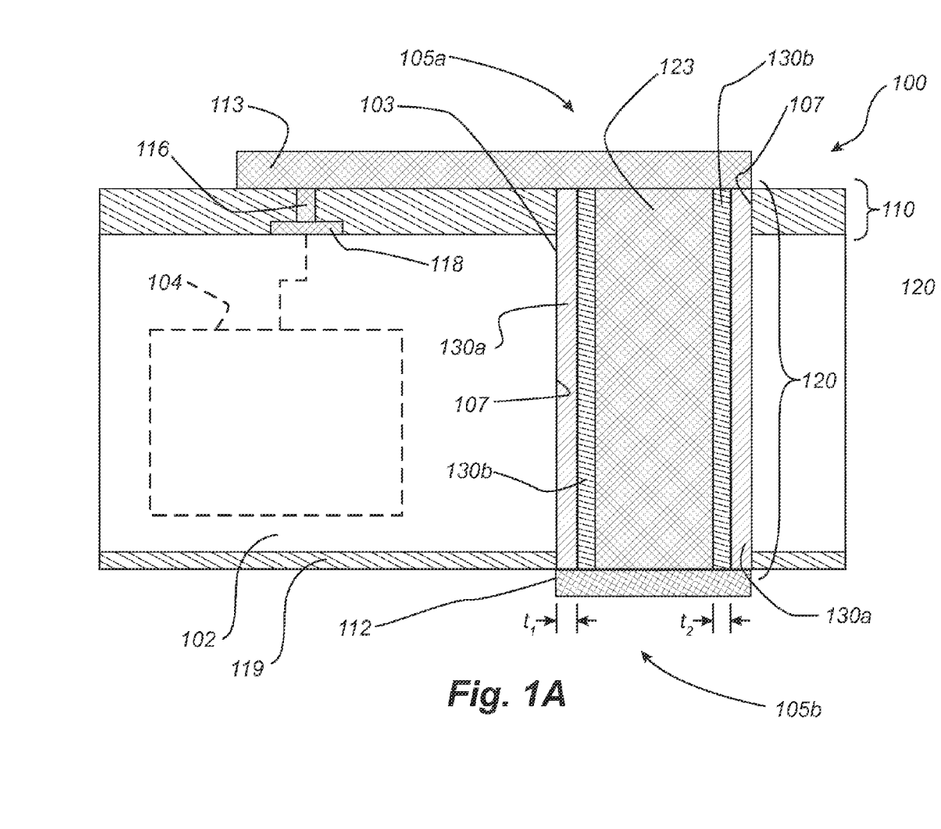
FIG. 1A is a cross-sectional view of a semiconductor device having an interconnect structure configured in accordance with an embodiment of the present technology.

FIG. 1A is a cross-sectional view of a semiconductor device 100 having an interconnect structure 120 ("interconnect 120") configured in accordance with an embodiment of the present technology. As shown, the semiconductor device 100 includes a substrate 102 and a dielectric structure 110 on the substrate 102. The substrate 102 includes a through hole, or opening 103, and the interconnect 120 extends through the opening 103 from a first side 105a (e.g., a top side) to a second side 105b (e.g., a bottom side). In the illustrated embodiment of FIG. 1A, the semiconductor device 100 includes a lower contact pad 112 coupled to the interconnect 120 at the second side 105b and electrically isolated from the substrate 102 by a dielectric isolation material 119. In one embodiment, the lower contact pad 112 can couple the interconnect 120 to an electrical contact at a lower level in a device package (not shown). For example, the lower contact pad 112 can couple the interconnect 120 to a contact pad on an underlying package substrate (not shown) or a contact pad on an underlying semiconductor die (not shown) in a stacked die arrangement.

The interconnect 120 includes a conductor 123 (e.g., a copper conductor) that electrically connects the lower contact pad 112 with a conductive trace 113 located at the first side 105a. The trace 113 extends laterally across the dielectric structure 110 and electrically connects the conductor 123 to a conductive via 116. The via 116, in turn, extends vertically through the dielectric structure 110 to connect the trace 113 to a buried substrate pad 118, and the substrate pad 118 ultimately connects the via 116 to an integrated circuit component 104 (shown schematically) within the substrate 102, such as a memory circuit, an LED, or other circuit component.

As further shown in FIG. 1A, a composite insulator 130, is disposed between the conductor 123 and a sidewall 107 in the opening 103. The composite insulator 130 includes a first insulator 130a (e.g., a silicon oxide insulator) having a first thickness $t_1$, and a second insulator 130b (e.g., a silicon oxide insulator) having a second thickness $t_2$ and disposed between the first insulator insular 130a and the conductor 123. In one aspect of this embodiment, the composite insulator 130 electrically isolates the conductor 123 from the substrate 102. In another aspect of this embodiment, the composite insulator 130 reduces the capacitance between the conductor 123 and the substrate 102 at the sidewall 107.

In general, conventional through-silicon interconnects (TSVs) are designed to have a low capacitance and low resistance to minimize RC time delay, power consumption, and crosstalk. TSVs are also designed to have a small diameter to optimize the integrated circuit density in a semiconductor die. As described below, capacitance generally increases with increasing TSV length and generally decreases with decreasing separation distance between TSV and the surrounding silicon substrate. However, small diameter TSVs usually have a relatively larger product of resistance and capacitance, and it is difficult to form a thick oxide insulator in a small-diameter through hole. In particular, conventional oxide deposition processes are less uniform in terms of step coverage, and they preferentially deposit thicker oxide on the flat substrate outside of the through hole. Consequently, the sidewall of TSV hole has a thin oxide, which is unfavorable for low capacitance. When the flat and thick oxide outside the TSV hole is removed, such as by chemical mechanical polishing (CMP), the thinner oxide in the through hole, especially toward the top of the through hole, is mechanically and/or chemically eroded. The eroded oxide can lead to topographical discontinuities. These discontinuities, in turn, can cause conductive structures above the TSV (e.g., traces) to short, and this can ultimately reduce manufacturing yield.

The interconnect structures of the various embodiments of the present technology, however, can address these and other limitations associated with conventional TSVs. For example, the first and second insulator thicknesses $t_1$ and $t_2$ can be selected to achieve a capacitance that is at or below a threshold level of capacitance. In some embodiments, the materials of the composite insulator 130 can also be selected to reduce capacitance. For example, the first insulator can be a low-K dielectric material (e.g., a fluorine- or carbon-doped oxide) and the second insulator can be a high-K dielectric material (e.g., oxynitride or a hafnium-based dielectric), and the low-K and high-K dielectrics can together define a suitable composite dielectric constant. In other embodiments, the composite insulator 130 can provide other advantages in addition to the reduced capacitance. For example, by selectively removing the first or second insulator material (or portions thereof) at the top and bottom sides of a through hole and then filling the hole with conductive material, the composite insulator 130 can reduce or prevent the erosion at the top of a through hole during planarization at the top side 105a. Also, this can alleviate stress/strain to prevent delamination of the composite insulator 130. The compositor insulator 130, with the increased sidewall dielectric thickness and reduced ratio of metal conductor 123 in the through hole opening 103, can reduce TSV cracking due to the CTE mismatch between metal conductor material and the silicon substrate.

Figure 1B:
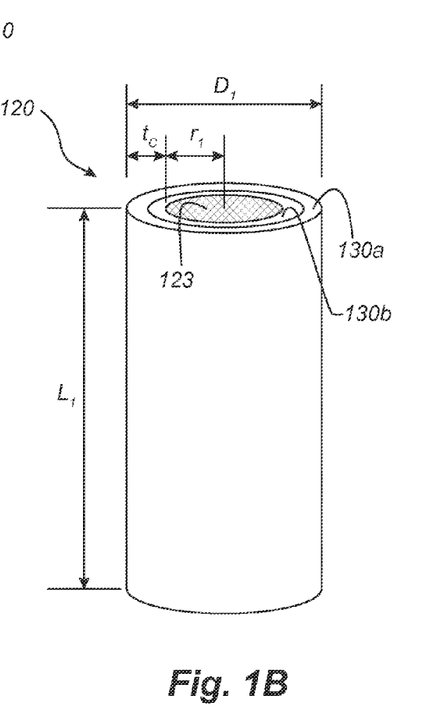
FIG. 1B is an isometric view of the interconnect structure of FIG. 1A.

FIG. 1B is an isometric view showing the interconnect 120 in more detail. As shown, the interconnect has a diameter $D_1$, and a vertical length, $L_1$. In one embodiment, the diameter $D_1$ can be approximated by Equation 1, as follows:

$$D_1 = 2(r_1 + t_1 + t_2) = 2(r_1 + t_C) \quad (1)$$

where $r_1$ is the radius of the conductor 123, and $t_C$ is the composite thickness of the composite insulator 130 (i.e., $t_1 + t_2$). In some embodiments, the diameter $D_1$ can be in the range of from about 1.0 μm to about 10 μm (e.g., 5 μm).

The capacitance of the interconnect 120 is generally a function of the vertical length $L_1$, the conductor radius $r_1$, the composite thickness $t_C$, the dielectric constant, $\in_1$, of the first insulator 130a, and the dielectric constant, $\in_2$, of the second insulator 130b. In one embodiment, the capacitance, $C_1$, of the interconnect 120 can be approximated based on the capacitance of a coaxial cable, as shown by Equation 2 and 3, as follows:

$$C_1 = 1/(L_1(2\pi\in_1)/\ln(1+t_1/r_1)) + 1/(L_1(2\pi\in_2)/\ln(1+t_2/r_1)) \quad (2)$$

$$C_1 = L_1(2\pi\in_C)/\ln(1+t_C/r_1) \quad (3)$$

where $\in_C$ is a composite of the first dielectric constant $\in_1$ and the second dielectric constant $\in_2$.

In various embodiments, the interconnect 120 can be configured to have a low capacitance $C_1$. For example, as shown by Equations 2 and 3, a larger composite thickness $t_C$ will reduce the capacitance $C_1$. As noted above, the first and second insulators 130a-b can collectively form a thick insulator to optimize the capacitance of the interconnect 120. The capacitance $C_1$ is thus based on the contributions (e.g., thickness) of two dielectric layers. In some embodiments, the first thickness $t_1$ can be in the range of from about 0.01 μm to about 1.5 μm (e.g., about 0.3 μm to about 1.0 μm), the second thickness $t_2$ can be in the range of from about 0.01 μm to about 1.5 μm (e.g., about 0.3 μm to about 1.0 μm), and the composite thickness $t_C$ can be in the range of from about to 0.1 μm to about 2.0 μm (e.g., 0.5 μm). In an additional or alternate embodiment, the first dielectric constant $\in_1$ can be different than the second dielectric constant $\in_2$ to further reduce or otherwise optimize the capacitance $C_1$.

Figure 2A:
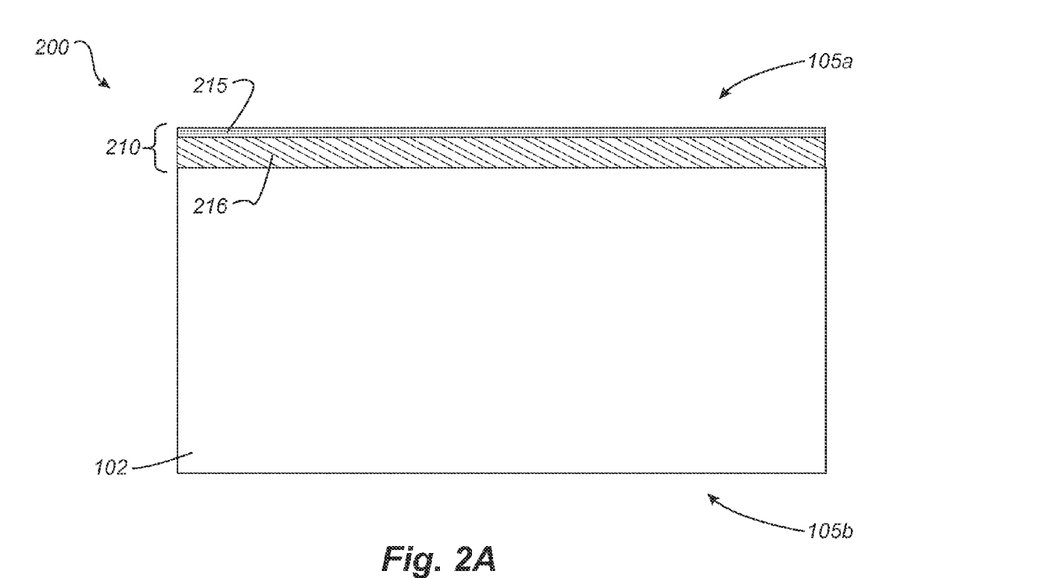
FIGS. 2A-2H are cross-sectional views showing a semiconductor die at various stages of a method for making interconnect structures in accordance with selected embodiments of the present technology.

FIGS. 2A-2H are cross-sectional views showing a semiconductor die 200 at various stages of a method for making interconnect structures and related connectors in accordance with selected embodiments of the present technology. Referring first to FIG. 2A, a dielectric structure 210 covers the substrate 102 at the first side 105a, and, a dielectric material 215 (e.g., silicon nitride or silicon carbide) can act as a stop layer during material removal processes, such as CMP. The underlying dielectric materials 216 can be part of the substrate 102. The dielectric structure 210 can further include vias, interconnects, and other conductive structures within the dielectric materials 215-216, such as the via 116 or the substrate pad 118 (FIG. 1A).

Figure 2B:
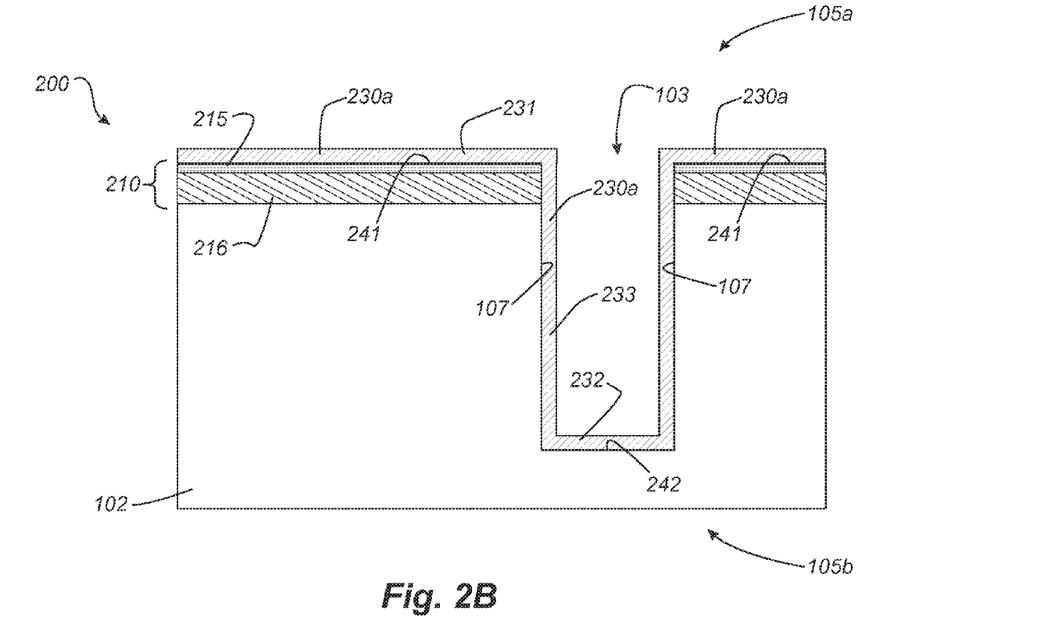

FIG. 2B shows the semiconductor die 200 after forming the opening 103 in an upper surface 241 and depositing a first insulator material 230a. As shown, the opening 103 extends completely through the dielectric structure 210 and a portion of the substrate 102, and the first insulator material 230a includes a first portion 231 on the upper surface 241, a second portion 232 on a lower surface 242 at the base of the opening 103, and a third portion 233 covering the sidewall 107 of the opening 103. In one embodiment, the first insulator material 230a is a silicon oxide film. For example, the first insulator material 230a can be a chemical vapor deposition (CVD) film, such as tetraethyl orthosilicate (TEOS). In another embodiment, the first insulator material 230a can be an atomic layer deposition film (ALD), such as a thin ALD film of silicon oxide or a thin ALD film of silicon nitride, having a thicknesses that is less than 1 μm, e.g., 0.1 μm. In other embodiments, the first insulator material 230a can include other types of material, such as a low-k dielectric, a high-k dielectric, and/or a carbon-rich material. In some embodiments, the first insulator material 230a can be doped, annealed, and/or otherwise treated (e.g., surface-roughened) to modify its dielectric properties.

Figure 2C:
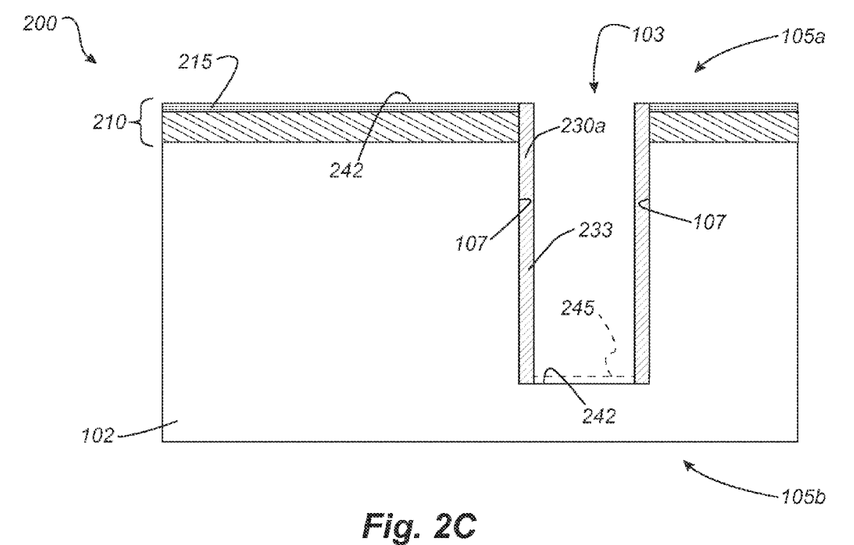

FIG. 2C shows the semiconductor die 200 after selectively removing the first and second portions 231-232 (FIG. 2B) of the first insulator material 230a. In one embodiment, the first and second portions 231-232 can be removed by an anisotropic etch (e.g., a reactive ion etch (RIE), and the dielectric material 215 (e.g., a low-K dielectric material) can be an etch stop. In some embodiments, an RIE etch can have an RIE lag configured to etch the first insulator material 230a at a first etch rate outside of the opening 103, and at a second etch rate that is slower at the base of the opening 103. In one such embodiment, the selective etch can completely remove the first portion 231 from the upper surface 241, but not completely remove the second portion 232 such that a residual portion 245 (shown in hidden lines) of the first insulator material 230a remains on the lower surface 242. For example, the selective etch can be configured to remove 0.5 μm of insulator material from the upper surface 241, but only 0.3 μm from the lower surface 242. In one aspect of this embodiment, the residual portion 245 can help protect the conductor 123 (FIG. 1A) from mechanical and/or chemical damage during back-side planarization (described below). In another aspect of this embodiment, a first insulator material 230a (deposited via, e.g., chemical vapor deposition), may be thicker at the upper surface 241, but thinner at the lower surface 242, and the RIE lag can clear the insulator both surfaces 241 and 242 in the same amount of etch time.

Figure 2D:
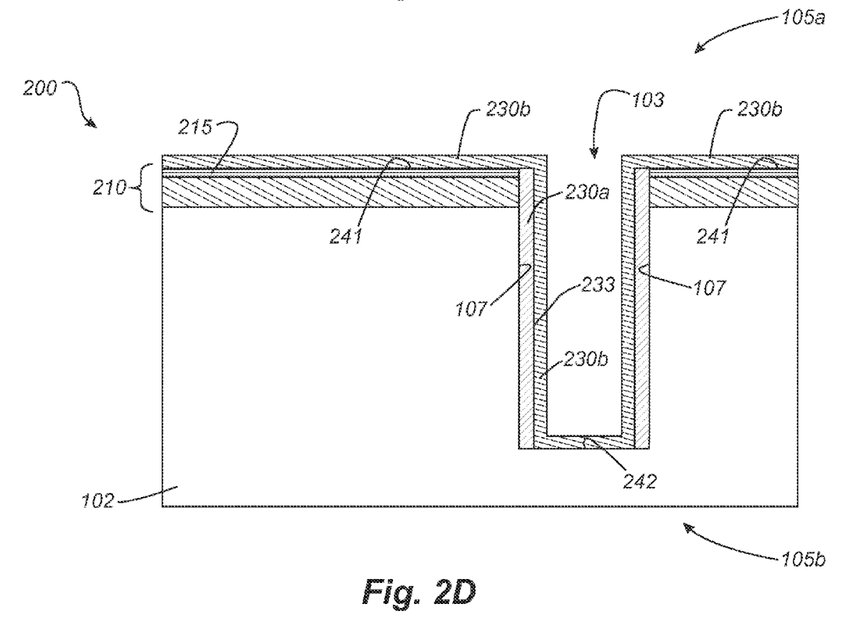

FIG. 2D shows the semiconductor die 200 after depositing a second insulator material 230b in the opening 103 and over the upper surface 241. In one embodiment, the second insulator material 230b can include the same material as the first insulator material 230a. For example, the first and second insulators can both be a TEOS film. In another embodiment, the second insulator material can be different than the first insulator material 230a. For example, the second insulator material 230b can be a thin ALD film (e.g., <0.1 μm), while the first insulator material 230a can be a thicker CVD film (e.g., >0.2 μm). Similar to the first insulator material 230a, the second insulator material 230b can also doped, annealed, and/or otherwise treated (e.g., surface-roughened) to modify its dielectric properties.

Figure 2E:
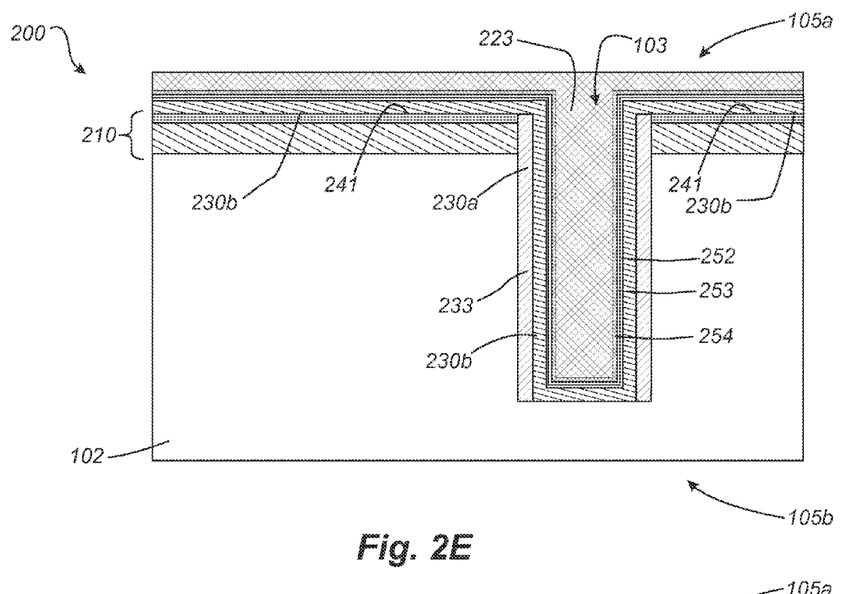
Figure 2F:
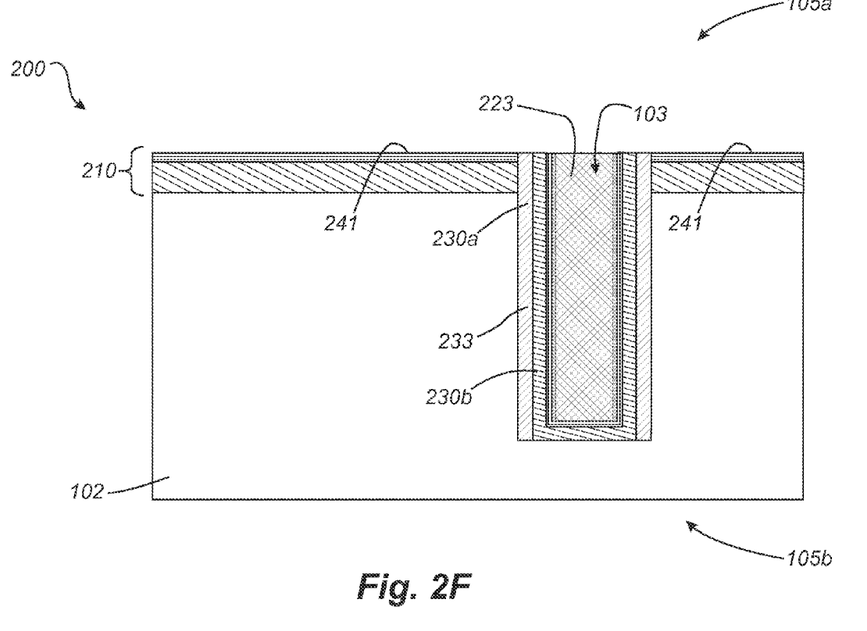

FIG. 2E shows the semiconductor die 200 after filling the opening 103 with a conductive material 223 (e.g., copper). In several embodiments, a barrier material 252 (e.g., tantalum or tantalum nitride), an interface material 253 (e.g.,—ruthenium) which is optional, and a seed material 254 (e.g., copper) can be deposited in sequence on the second insulator material 230b. The conductive material 223 can be deposited onto the seed material 254 (e.g., via electroplating or electroless plating). FIG. 2F shows the semiconductor die 200 after removing the excess conductive material 223 located outside of the opening 103 and the second insulator material 230b that was underneath the conductive material 223, such as by CMP and/or another suitable material removal process. As noted above, the dielectric material 215 can act as a polish-stop during such material removal. As noted above, the first and second insulator materials 230a-b can have a composite thickness configured to prevent substantial degradation of the insulator material during planarization to prevent erosion effects and a concomitant reduction in yield.

Figure 2G:
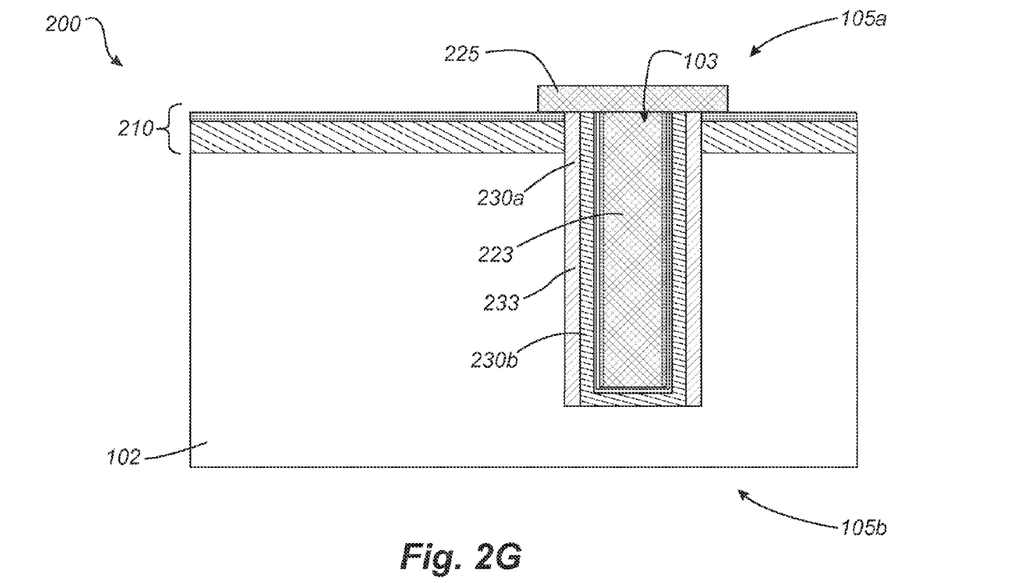

FIG. 2G shows the semiconductor die 200 after forming a contact pad 255 (e.g., a copper pad) on the conductive material 223 at the first side 105a. In one aspect of this embodiment, the contact pad 255 can provide a contact site for connecting the semiconductor die 200 to an adjacent die, such as another die stacked upon the semiconductor die 200 during assembly of a die stack. In other embodiments, the trace 113 (FIG. 1A) can be formed in lieu of the contact pad 255, or the contact pad 255 can be integral with the trace 113.

Figure 2H:
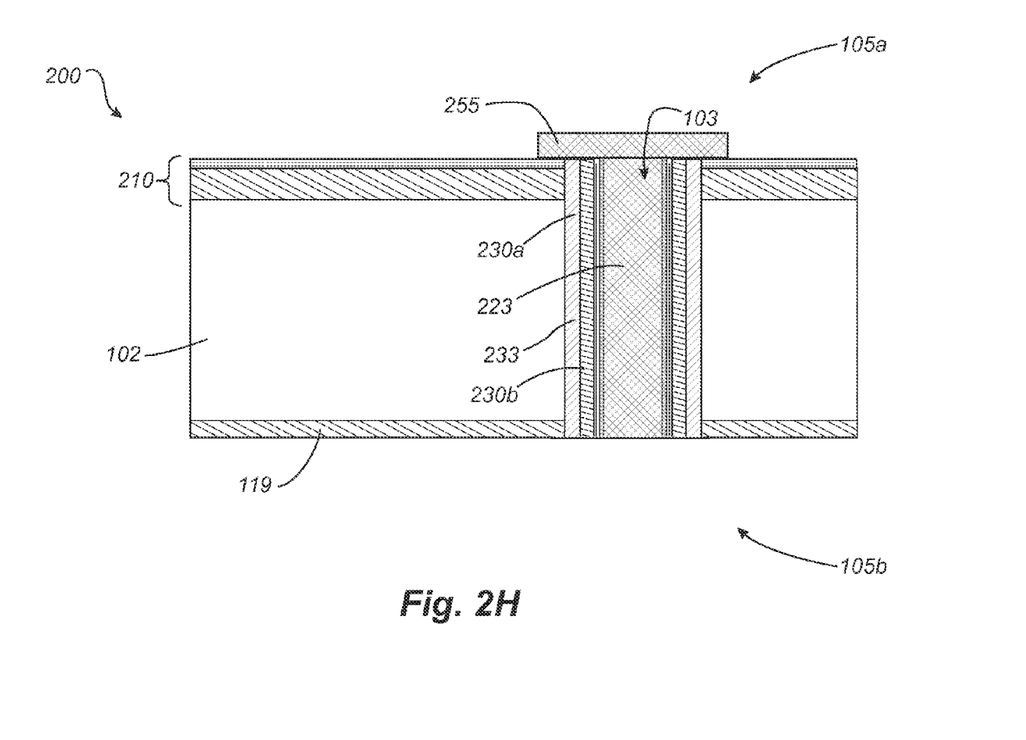

FIG. 2H shows the semiconductor die 200 after thinning the substrate 102 at the second side 105b to complete the TSV (e.g., the combination of the conductive material 223, the remaining portion of the second insulator material 230b, and the third portion 233 of the first insulator material 230a along the sidewall 107 of the opening 103). In at least some embodiments, the dielectric isolation material 119 can be formed by selectively removing substrate material from the second side 105b to expose the underlying insulation material (but not the conductive material 223), depositing the isolation material 119 on the second side 105b of the exposed insulation material and the substrate, and then thinning the isolation material 119 (e.g., via CMP, back-grinding, etching, etc.) to expose the conductive material 223 through the isolation material 119. After the TSV metal is exposed, processing can continue to a subsequent stage, such as one or more stages for forming the lower contact pad 112 (FIG. 1A), bonding the semiconductor die to other dies, die encapsulation, etc.

Figure 3A:
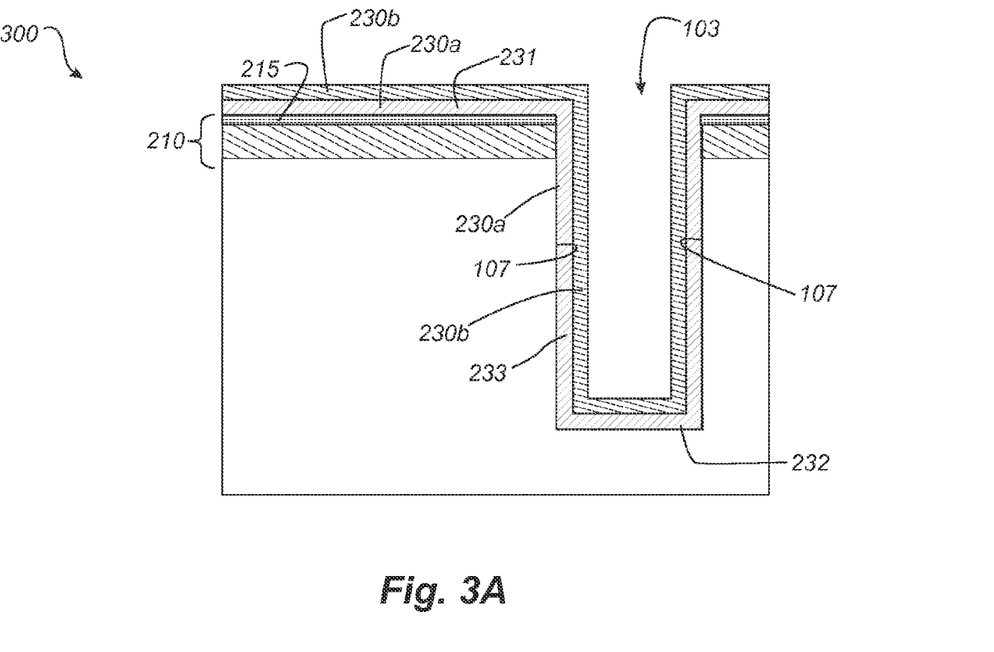
FIGS. 3A and 3B are cross-sectional views showing a semiconductor die at various stages of another method for making interconnect structures in accordance with selected embodiments of the present technology.
Figure 3B:
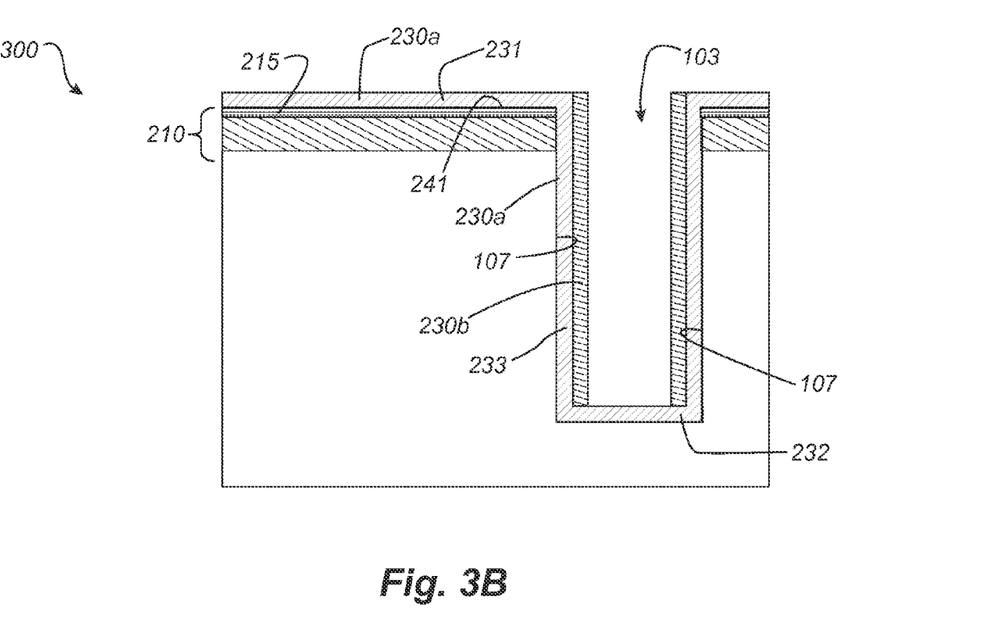

FIGS. 3A and 3B are cross-sectional views showing a semiconductor die 300 at various stages of another method for making interconnect structures in accordance with selected embodiments of the present technology. In one embodiment, the stages shown in FIGS. 3A and 3B can be an alternative to the stages shown in FIGS. 2C and 2D, respectively. For example, as shown in FIG. 3A, the second insulator material 230b is deposited on the first insulator material 230a before removing any of the first insulator material 230a. Referring to FIG. 3B, the second insulator material 230b is then selectively etched, such as with an anisotropic etch, to remove the horizontal portions of the second insulator material 230b over the dielectric material 215 and at the base of the opening 103. In one aspect of the illustrated embodiment of FIG. 3B, once the second insulator material 230b has been removed, the anisotropic etch can also thin the first and second portions 231-232 of the first insulator material 230a. After the stage shown in FIG. 3B, the semiconductor die 300 can be processed as shown in FIGS. 2E-2H to form a finished TSV.

Figure 4A:
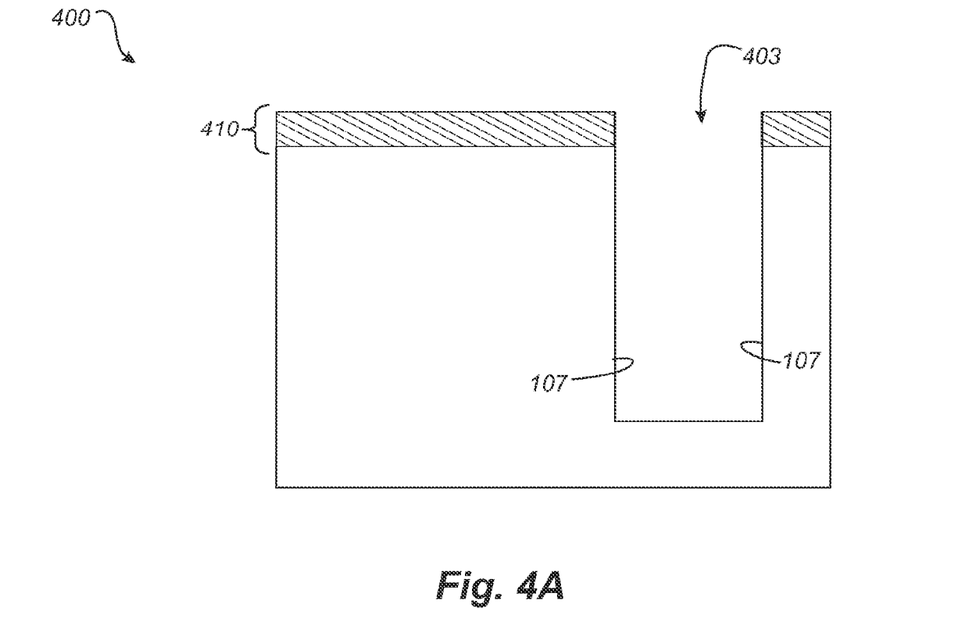
FIGS. 4A-4D are cross-sectional views showing a semiconductor die at various stages of another method for making interconnect structures in accordance with selected embodiments of the present technology.
Figure 4B:
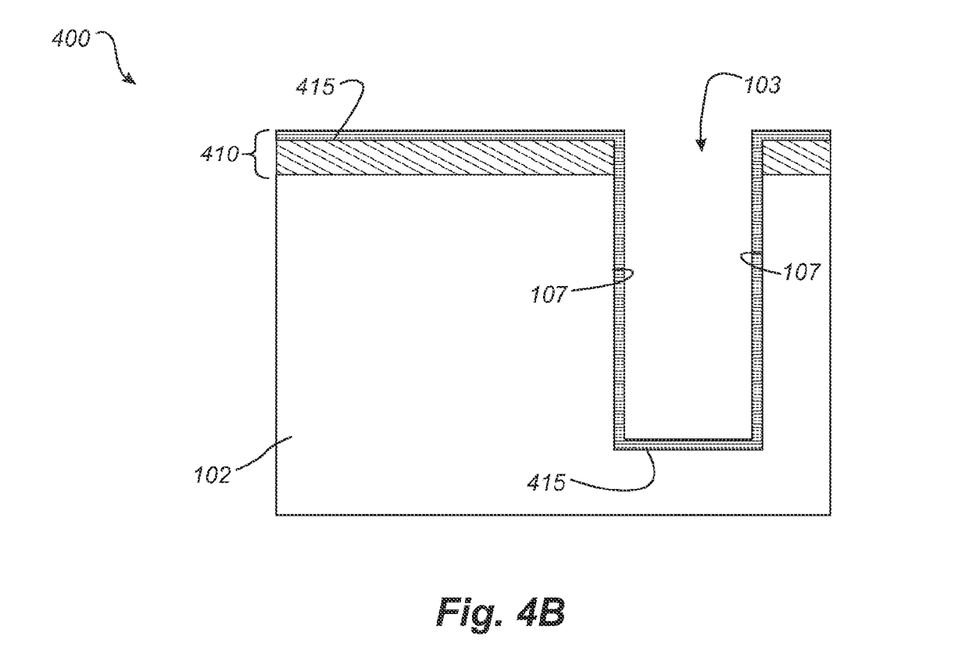
Figure 4C:
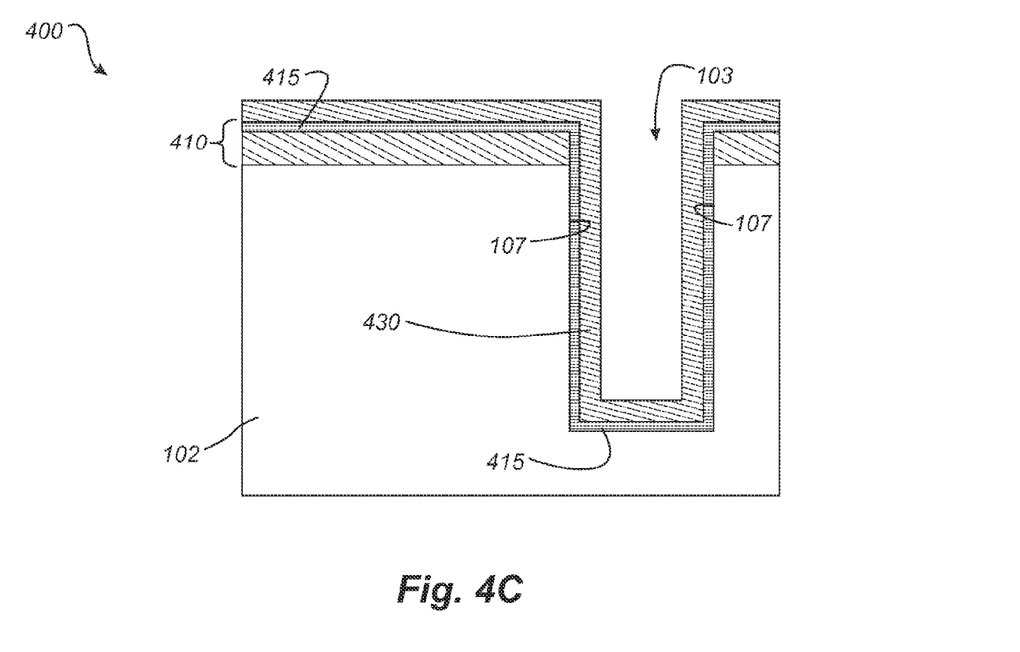
Figure 4D:
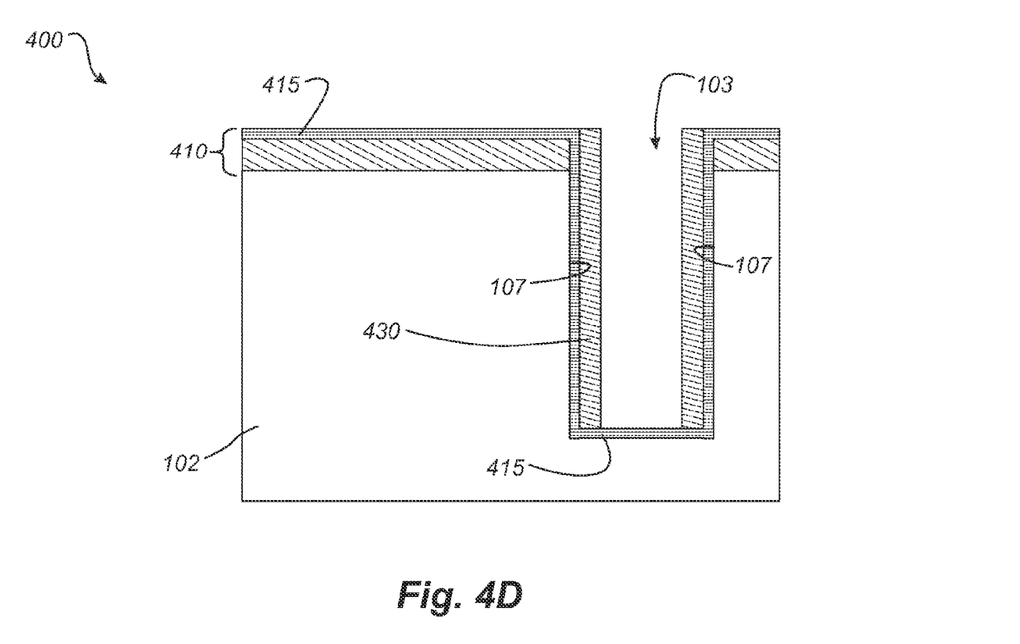

FIGS. 4A-4D are cross-sectional views showing a semiconductor die 400 at various stages of another method for making interconnect structures in accordance with selected embodiments of the present technology. In one embodiment, the stages shown in FIGS. 4A-4D can be an alternative to the stages shown in FIGS. 2A-2D, respectively. For example, as shown in FIG. 4A, the opening 103 is formed through a dielectric structure 410 that does not include the dielectric material 215 (FIG. 2A). Referring to FIG. 4B, a dielectric material 415 is subsequently formed on the dielectric structure 410 and also within the opening 103. After the stage shown in FIG. 4B, an insulator material 430 is deposited on the dielectric 415 (as shown FIG. 4C), and portions of the insulator material 430 are then removed to expose the underlying dielectric 415 (as shown in FIG. 4D). In one aspect of the illustrated embodiment of FIG. 4D, the dielectric 415 can be an etch stop at the base of the opening 103. After the stage shown in FIG. 4D, the semiconductor die 400 can be processed as shown in FIGS. 2E-2H to form a finished TSV.

Figure 5:
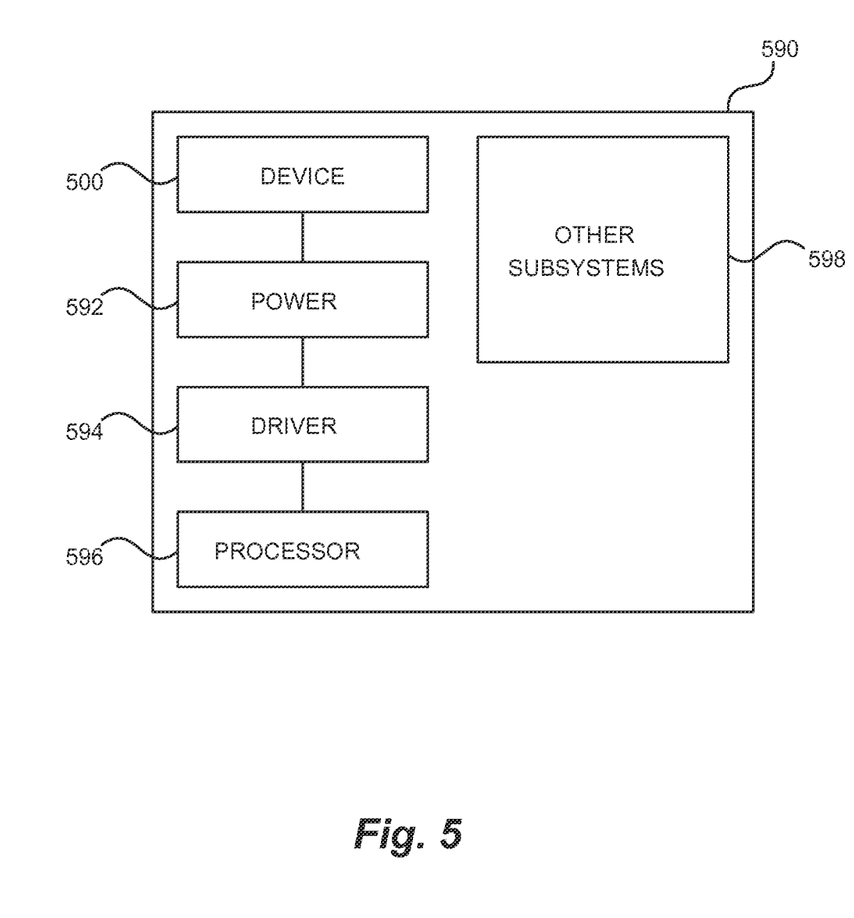
FIG. 5 is a schematic view of a system that includes a semiconductor device having an interconnect structure configured in accordance with embodiments of the present technology.

Any one of the interconnect structures and/or semiconductor devices described above with reference to FIGS. 1A-4D can be incorporated into any of a myriad of larger and/or more complex systems, a representative example of which is system 590 shown schematically in FIG. 5. The system 590 can include a semiconductor device 500, a power source 592, a driver 594, a processor 596, and/or other subsystems or components 598. The semiconductor device 500 can include features generally similar to those of the stacked semiconductor die assemblies described above, and can therefore include one or more of the interconnect structures of the various embodiments. The resulting system 590 can perform any of a wide variety of functions, such as memory storage, data processing, and/or other suitable functions. Accordingly, representative systems 590 can include, without limitation, hand-held devices (e.g., mobile phones, tablets, digital readers, and digital audio players), computers, and appliances. Components of the system 590 may be housed in a single unit or distributed over multiple, interconnected units (e.g., through a communications network). The components of the system 590 can also include remote devices and any of a wide variety of computer readable media.

From the foregoing, it will be appreciated that specific embodiments of the technology have been described herein for purposes of illustration, but that various modifications may be made without deviating from the disclosure. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor device, comprising:
   a semiconductor die including a substrate and an opening formed in the substrate, wherein the substrate includes a first side, a second side opposite the first side, and a sidewall extending through the opening, wherein the opening has a length defined at least between the first and second sides of the substrate; and
   an interconnect structure, including—
      a conductor at least partially filling the opening, and
      a composite insulator at least between the sidewall and the conductor, wherein the composite insulator includes a first insulator formed by chemical vapor deposition (CVD) on the sidewall, and a second insulator formed by CVD on the first insulator, wherein the second insulator is between the first insulator and the conductor, wherein the first insulator has a first thickness in the range between about 0.1 μm and 1.5 μm, and the second insulator has a second thickness of about at least 0.01 μm, and wherein the first thickness is greater than or equal to the second thickness over the length of the opening.

2. The semiconductor device of claim 1 wherein at least one of the first insulator and the second insulator is formed from tetraethyl orthosilicate (TEOS).

3. The semiconductor device of claim 1 wherein one of the first insulator and the second insulator is formed from tetraethyl orthosilicate (TEOS), while the other is formed from a material different than TEOS.

4. The semiconductor device of claim 1 wherein the first and second thickness form a composite thickness that is greater than about 0.3 μm.

5. The semiconductor device of claim 1 wherein the first thickness is greater than 0.3 μm.

6. The semiconductor device of claim 1 wherein the second thickness is greater than 0.1 μm.

7. The semiconductor device of claim 1 wherein the semiconductor die is a memory die.

8. The semiconductor device of claim 1 wherein the interconnect structure has a diameter in the range of about 1.0 μm to about 10 μm.

9. The semiconductor device of claim 1 wherein the first and second thicknesses define a composite thickness of about at least 0.5 μm.

10. A semiconductor device, comprising
    a semiconductor die having a substrate and a hole extending into the substrate, wherein the substrate includes a first side and a second side opposite the first side, and wherein the hole has a length defined at least between the first and second sides of the substrate; and
    a composite insulator in the hole and having a composite dielectric constant, the composite insulator including—
       a first insulator on the sidewall and having a first dielectric constant that is different than the composite dielectric constant, wherein the first insulator has a first thickness of about at least 0.1 μm in the hole, and
       a second insulator on the first insulator and having a second dielectric constant that is different than the composite dielectric constant, wherein the second insulator has a second thickness in the hole, and wherein the first thickness is greater than or equal to the second thickness over the length of the hole; and
    a conductor on the composite insulator.

11. The semiconductor device of claim 10 wherein the first thickness of the first insulator is greater than the second thickness of the second insulator.

12. The semiconductor device of claim 10 wherein the first thickness of the first insulator is in the range between about 0.1 μm and 1.5 μm.

13. The semiconductor device of claim 10 wherein the first dielectric constant is greater than the second dielectric constant.

14. The semiconductor device of claim 10 wherein the first dielectric constant is less than the second dielectric constant.

15. The semiconductor device of claim 10 wherein the first insulator includes a low-K dielectric.

16. The semiconductor device of claim 15 wherein the second insulator includes a high-K dielectric.

17. The semiconductor device of claim 10 wherein the first and second materials are each composed of silicon oxide.

18. The semiconductor device of claim 10 wherein the first insulator is formed by chemical vapor deposition (CVD) on the sidewall.

19. The semiconductor device of claim 18 wherein the second insulator is formed by CVD on the first insulator.

20. A semiconductor device, comprising
    a semiconductor die having a first side, a second side opposite the first side, and a hole extending into the die, wherein the hole has a vertical sidewall extending between the first and second sides, and wherein the hole has a length defined at least between the first and second sides of the die;
    a composite insulator in the hole, the composite insulator including—
       a first insulator on the sidewall and having a first thickness of at least 0.1 μm, and a second insulator on the first insulator and having a second thickness that is less than or equal to the first thickness over the length of the hole; and a conductor on the composite insulator, the conductor forming an interconnect structure with the composite insulator, the interconnect structure having a diameter in the range between about 1.0 μm and 10 μm.

21. The semiconductor device of claim 20 wherein the first thickness of the first insulator is greater than or equal to the second thickness of the second insulator.

* * * * *